United States Patent
Kono et al.

(10) Patent No.: US 9,379,234 B2
(45) Date of Patent: Jun. 28, 2016

(54) SEMICONDUCTOR DEVICE

(71) Applicant: Kabushiki Kaisha Toshiba, Minato-ku, Tokyo (JP)

(72) Inventors: Hiroshi Kono, Himeji Hyogo (JP); Takao Noda, Himeji Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/473,246

(22) Filed: Aug. 29, 2014

(65) Prior Publication Data
US 2015/0263158 A1    Sep. 17, 2015

(30) Foreign Application Priority Data
Mar. 14, 2014    (JP) .................. 2014-052801

(51) Int. Cl.
| | |
|---|---|
| H01L 27/108 | (2006.01) |
| H01L 29/78 | (2006.01) |
| H01L 29/10 | (2006.01) |
| H01L 29/06 | (2006.01) |
| H01L 29/08 | (2006.01) |
| H01L 29/16 | (2006.01) |

(52) U.S. Cl.
CPC ........ *H01L 29/7804* (2013.01); *H01L 29/0696* (2013.01); *H01L 29/086* (2013.01); *H01L 29/1095* (2013.01); *H01L 29/7805* (2013.01); *H01L 29/1608* (2013.01)

(58) Field of Classification Search
CPC ................ H01L 29/7804; H01L 127/0629
USPC ........................................ 257/296
See application file for complete search history.

(56) References Cited

U.S. PATENT DOCUMENTS

| | | | |
|---|---|---|---|
| 5,915,179 A | 6/1999 | Etou et al. | |
| 2014/0225126 A1* | 8/2014 | Aketa | ............... H01L 29/41766 257/77 |

FOREIGN PATENT DOCUMENTS

| | | |
|---|---|---|
| JP | 2002-299625 A | 10/2002 |
| JP | 2005-243936 A | 9/2005 |

* cited by examiner

*Primary Examiner* — Julio J Maldonado
*Assistant Examiner* — Hajar Kolahdouzan
(74) *Attorney, Agent, or Firm* — White & Case LLP

(57) ABSTRACT

According to one embodiment, a semiconductor device includes first electrode, second electrode, and third electrodes, first, second, third, fourth, and fifth semiconductor regions. The first semiconductor region is provided between the first and second electrodes. The second semiconductor region is provided between the first semiconductor region and the second electrode. The third semiconductor region is provided between the second semiconductor region and the second electrode. The third semiconductor region has an impurity concentration higher than an impurity concentration of the first semiconductor region. The third electrode contacts the third, second, and first semiconductor regions via an insulating film. The fourth semiconductor region is provided between the first semiconductor region and the second electrode. The fifth semiconductor region is provided between the fourth semiconductor region and the second electrode. The fifth semiconductor region has an impurity concentration higher than the impurity concentration of the first semiconductor region.

16 Claims, 7 Drawing Sheets

SEMICONDUCTOR DEVICE

CROSS-REFERENCE TO RELATED APPLICATIONS

This application is based upon and claims the benefit of priority from Japanese Patent Application No. 2014-052801, filed on Mar. 14, 2014; the entire contents of which are incorporated herein by reference.

FIELD

Embodiments described herein relate generally to a semiconductor device.

BACKGROUND

Inverter circuits and the like are provided with a switching element (for example, a MOSFET) and a reflux diode connected in parallel to the switching element. With inverter operation, causing current (reverse conduction) to flow to the reflux diode can prevent destruction to the switching element. However, when a semiconductor chip having a switching element and a chip having a reflux diode are each separate chips, there are adverse effects, namely, the module of the inverter circuit or the like becomes larger, the miniaturization of the module cannot be attained, and costs also rise.

DETAILED DESCRIPTION

Figure 1A:
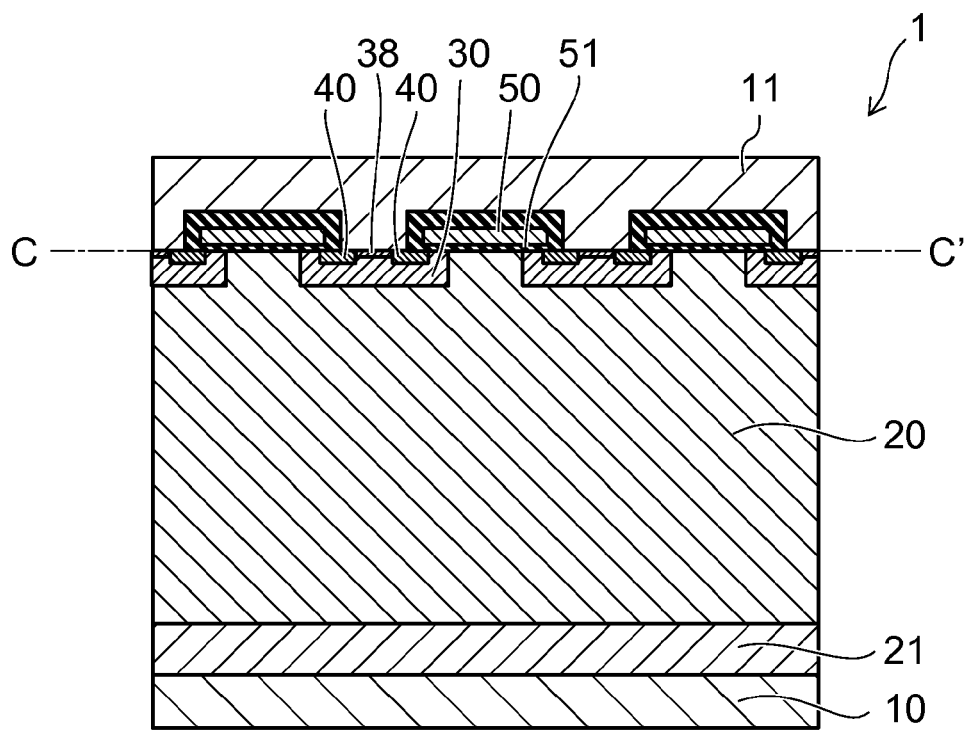
FIG. 1A and FIG. 1B are schematic cross-sectional views showing a semiconductor device according to the embodiment.

According to one embodiment, a semiconductor device includes a first electrode, a second electrode, a first semiconductor region, a second semiconductor region, a third semiconductor region, a third electrode, a fourth semiconductor region, and a fifth semiconductor region. The first semiconductor region is of a first conductivity type and provided between the first electrode and the second electrode. The second semiconductor region is of a second conductivity type and provided between the first semiconductor region and the second electrode. The third semiconductor region is of the first conductivity type and provided between the second semiconductor region and the second electrode. The third semiconductor region has an impurity concentration higher than an impurity concentration of the first semiconductor region. The third electrode contacts the third semiconductor region, the second semiconductor region, and the first semiconductor region via an insulating film. The fourth semiconductor region is of the second conductivity type and provided between the first semiconductor region and the second electrode. The fifth semiconductor region is of the first conductivity type and provided between the fourth semiconductor region and the second electrode. The fifth semiconductor region has an impurity concentration higher than the impurity concentration of the first semiconductor region.

Various embodiments will be described hereinafter with reference to the accompanying drawings. In the following description, the same reference numeral is applied to the same member, and for members that have been described once, the description is omitted as appropriate.

Figure 1B:
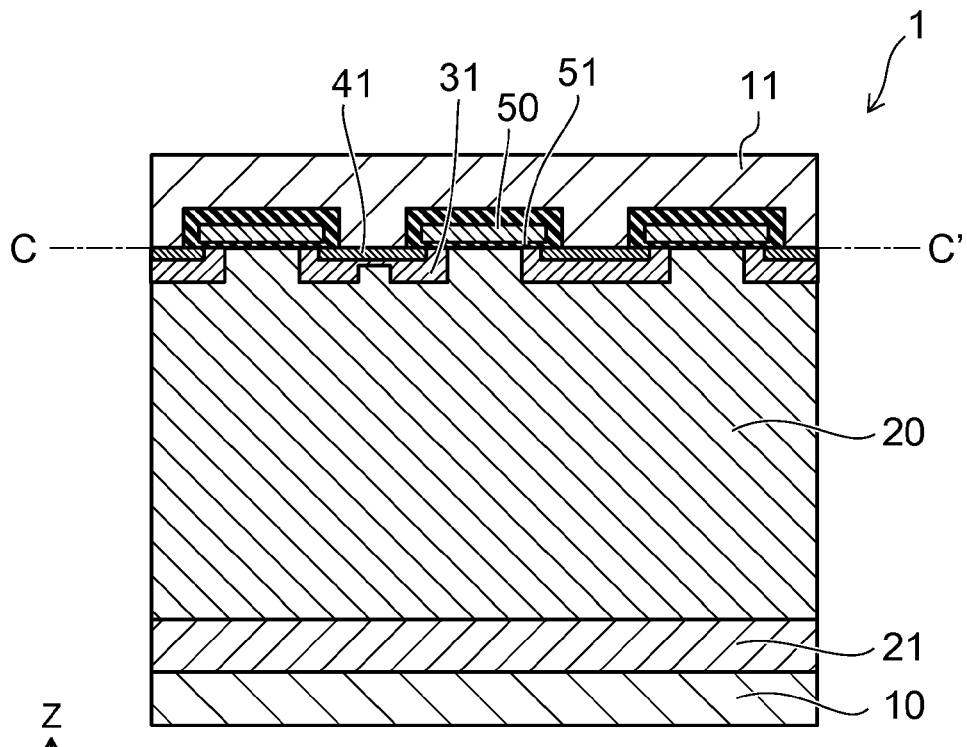

FIG. 1A and FIG. 1B are schematic cross-sectional views showing a semiconductor device according to the embodiment.

Figure 2:
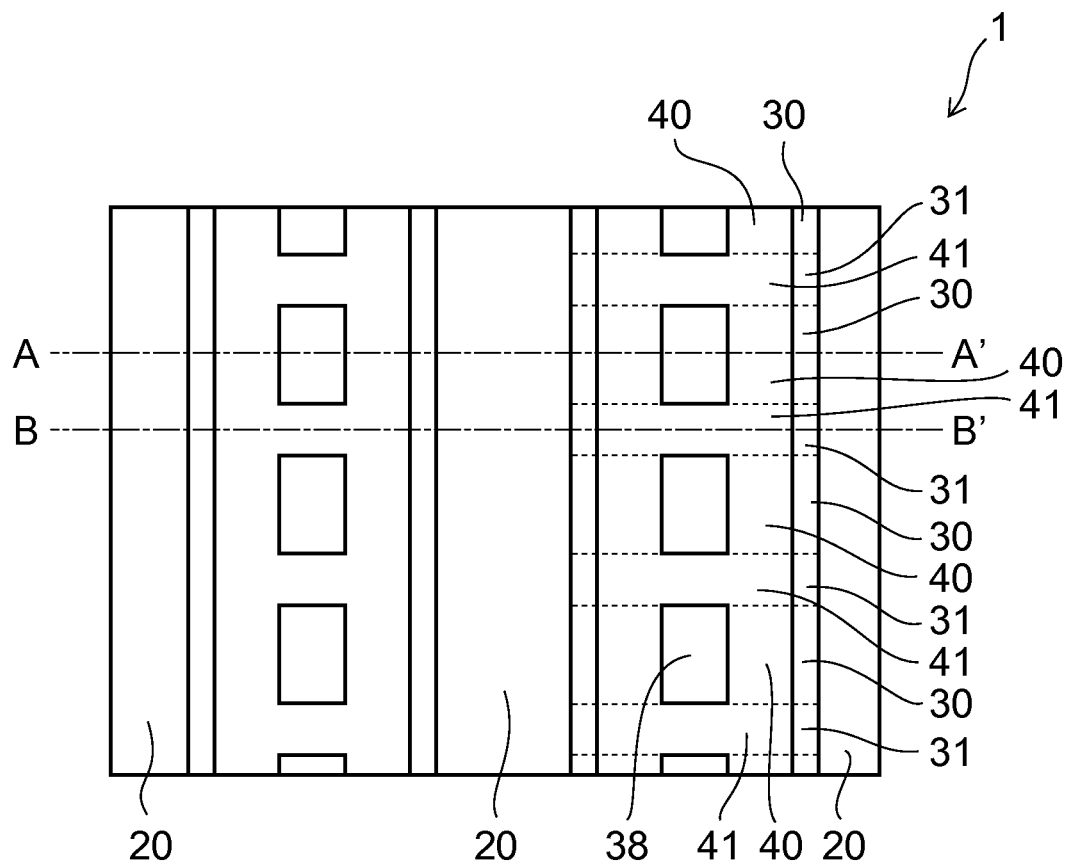
FIG. 2 is a schematic plan view showing the semiconductor device according to the embodiment.

FIG. 2 is a schematic plan view showing the semiconductor device according to the embodiment.

Here, a cross-section on the A-A' line of FIG. 2 is shown in FIG. 1A, and a cross-section on the B-B' line of FIG. 2 is shown in FIG. 1B. Also, a cross-section on the C-C' line of FIGS. 1A and 1B is shown in FIG. 2.

A semiconductor device 1 is a metal oxide semiconductor field effect transistor (MOSFET) with a top and bottom electrode structure having a reflux diode. In the embodiment, as one example, an n-channel type MOSFET is shown.

The semiconductor device 1 is provided with a drain electrode 10 (first electrode) and a source electrode 11 (second electrode). An n-type drift region 20 (first semiconductor region) is provided between the drain electrode 10 and the source electrode 11. Further, an $n^+$-type drain region 21 is provided between the drain electrode 10 and the drift region 20. A p-type base region 30 (second semiconductor region) is provided between the drift region 20 and the source electrode 11.

As shown in FIG. 1A, an $n^+$-type source region 40 (third semiconductor region) is provided between the base region 30 and the source electrode 11. The impurity concentration of the source region 40 is higher than the impurity concentration of the drift region 20. The source region 40 is in ohmic contact with the source electrode 11.

The source region 40, the base region 30, and the drift region 20 contact a gate electrode 50 (third electrode) via a gate insulating film 51 (insulating film). The gate electrode 50 extends in an X-direction (second direction) that intersects with a Z-direction (first direction) from the drain electrode 10 toward the source electrode 11.

A $p^+$-type contact region 38 (sixth semiconductor region) which has a higher impurity concentration than that of the base region 30, is provided between the base region 30 and the source region 11. An example where the contact region 38 contacts the source region 40 is shown in the diagrams, but the contact region 38 and the source region 40 are not always required to contact. Note that the contact region 38 is in ohmic contact with the source electrode 11.

Further, as shown in FIG. 1B, a p-type or a $p^-$-type semiconductor region 31 (fourth semiconductor region) is provided between the drift region 20 and the source electrode 11. An $n^+$-type semiconductor region 41 (fifth semiconductor region) is provided between the semiconductor region 31 and the source electrode 11. The impurity concentration of the semiconductor region 41 is higher than the impurity concentration of the drift region 20. The semiconductor region 41 is in ohmic contact with the source electrode 11. The semiconductor region 41 may be formed at the same time as the source region 40, or they may be formed separately. The impurity concentration and impurity concentration profile of the semiconductor region 41 may be the same as or differ from those of the source region 40. Furthermore, the impurity concentration and the impurity concentration profile may be modified depending on each location of the semiconductor region 41 and the source region 40.

As shown in FIG. 2, the base region 30 and the semiconductor region 31 are alternately arranged in the X-direction. In FIG. 2, the source region 40 and the semiconductor region 41 are alternately arranged in the X-direction. Further, in FIG. 2, the contact region 38 is sandwiched between the semiconductor regions 41 adjacent in the X-direction.

In the embodiment, the above structure of alternately arranging is not always required. For example, a set of the source region 40, the contact region 38, and the base region 30 and a set of the semiconductor region 41 and the semiconductor region 31 may be dispersed respectively at a predetermined ratio. In this case, it is not necessary to make the former and the latter 50%:50%.

Further, $n^+$-types and n-types may be referred to as first conductivity types and $p^+$-types, p-types, and $p^-$-types may be referred to as second conductivity types. Here, the impurity concentration gets lower in the order of $n^+$-types, n-types, and $p^+$-types, p-types, and $p^-$-types.

Also, the "impurity concentration" described above refers to the effective concentration of an impurity element that contributes to the conductivity of a semiconductor material. For example, when an impurity element that becomes a donor and an impurity element that becomes an acceptor are contained in the semiconductor material, the concentration of the activated impurity elements excluding offset of the donor and the acceptor is defined as the impurity concentration.

The main component of the drift region 20, the drain region 21, the base region 30, the source region 40, the contact region 38, the semiconductor region 31, and the semiconductor region 41, respectively, is, for example, silicon carbide (SiC), silicon (Si), and the like.

When silicon carbide (SiC) is used as the main component in the semiconductor material of the semiconductor device 1, nitrogen (N), phosphorus (P), and the like, for example, can be applied as the impurity element of the first conductivity type; and aluminum (Al), boron (B), and the like can be applied as the impurity element of the second conductivity type.

When silicon (Si) is used as the main component in the semiconductor material of the semiconductor device 1, phosphorus (P), arsenic (As), and the like, for example, can be applied as the impurity element of the first conductivity type; and boron (B) and the like can be applied as the impurity element of the second conductivity type.

The material of the drain electrode 10 and the source electrode 11 is a metal containing at least one selected from the group consisting of aluminum (Al), titanium (Ti), nickel (Ni), tungsten (W), gold (Au), and the like. Alternatively, the material of the drain electrode 10 and the source electrode 11 may be consist of at least one metal film given above and a silicide film.

The gate electrode 50 contains polysilicon, metal and the like with an impurity element introduced. Further, in the embodiment, the insulating film is an insulating film that contains, for example, silicon oxide ($SiO_x$), silicon nitride ($SiN_x$), and the like.

An operation of the semiconductor device 1 will be described.

In the embodiment, a case will be described where silicon carbide (SiC) is used as the main component in the semiconductor material. In the semiconductor device 1, when a high voltage is applied to the drain electrode 10 relative to the source electrode 11, and a voltage that is equal to or higher than a threshold voltage (Vth) is applied to the gate electrode 50, a channel is formed in the base region 30 along the gate insulating film 51, and the semiconductor device 1 is turned ON. Meanwhile, when a voltage lower than the threshold voltage (Vth) is applied to the gate electrode 50, the channel is not formed, and the semiconductor device 1 is turned OFF.

Furthermore, when the semiconductor device 1 is incorporated into an electronic circuit of an inverter circuit or the like, the drain electrode 10 may be negatively biased with respect to the source electrode 11 due to, for example, a surge current generated in the electronic circuit. The reflux diode (built-in diode) is provided in the semiconductor device 1 to prevent the electronic circuit from being destroyed due to the surge current.

An operation of the reflux diode will be described.

Figure 3A:
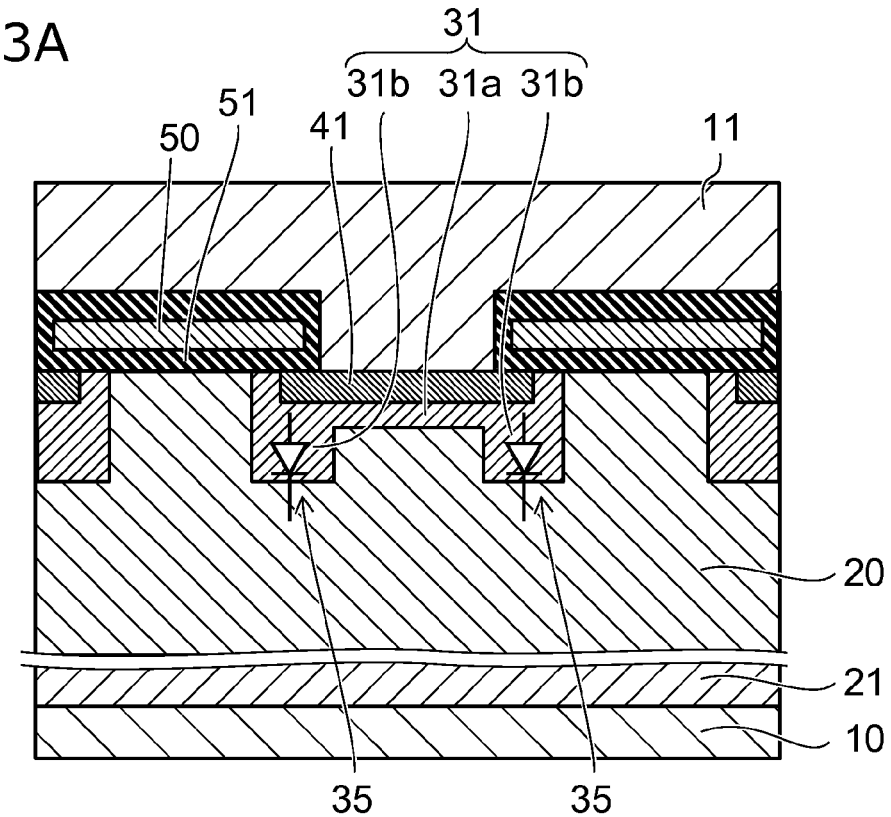
FIG. 3A and FIG. 3B are schematic cross-sectional views showing a semiconductor device according to the embodiment.
Figure 3B:
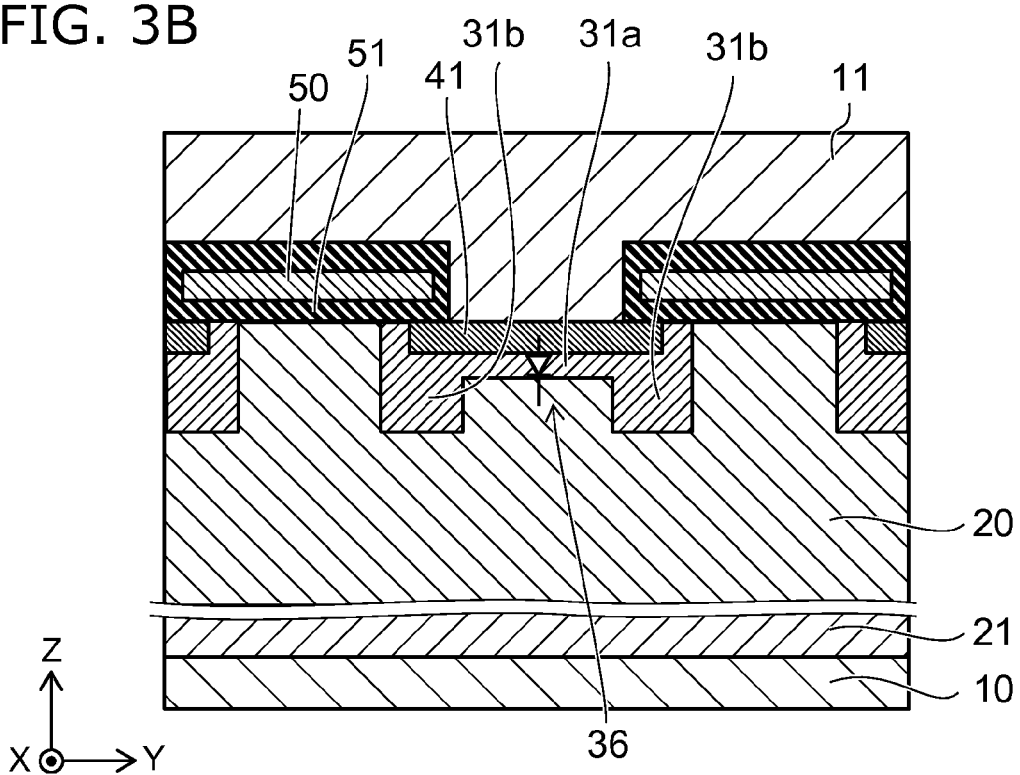

FIG. 3A and FIG. 3B are schematic cross-sectional views showing a semiconductor device according to the embodiment.

In FIG. 3A and FIG. 3B, a diagram is shown where the semiconductor region 31 and the area around the semiconductor region 31 is enlarged.

The semiconductor region 31 has a $p^-$-type first portion 31a, and p-type second portions 31b sandwiching the first portion 31a. The impurity concentration of the first portion 31a is lower than the impurity concentration of the second portion 31b. The thickness of the first portion 31a is thinner than the thickness of the second portion 31b. The semiconductor region 41 is provided between the first portion 31a and the source electrode 11.

First, the semiconductor device 1 has a PIN diode 35 configured of the second portion 31b, the drift region 20, and the drain region 21. When the drain electrode 10 is negatively biased with respect to the source electrode 11, the second portion 31b becomes positively biased with respect to the drift region 20. Then, when the rising voltage between the second portion 31b and the drift region 20 is exceeded, current flows from the source side to the drain side (reverse conduction).

Here, a so-called bipolar operation occurs where a hole is injected in the drift region 20 from the second portion 31b, and an electron is injected in the second portion 31b from the drift region 20.

However, when silicon carbide (SiC) is used as the main component of the semiconductor material, a built-in potential of a p-n junction (for example, approximately 3V) is large compared to a built-in potential of a PN diode having silicon as the main component. This is because the built-in potential of the p-n junction is determined by the material characteristics of the second portion 31b and the drift region 20. Therefore, it is easier for conduction loss to occur in the PIN diode 35 compared to a PN diode having silicon as the main component.

When holes continue to be injected in the silicon carbide crystal, basal plane dislocation (BPD) may form a stacking fault due to the injection of holes. These stacking faults cause an increase of leakage current when the FET is off, an increase in resistance when on, and characteristic degradation at the time of reverse conduction.

Therefore, in the semiconductor device 1, as shown in FIG. 3B, the n+-type semiconductor region 41, the p−-type first portion 31a, and the drift region 20 are arranged in the Z-direction. In other words, the semiconductor device 1 has an n+-type/p−/n-type diode 36.

With the diode 36, when the drain electrode 10 is negatively biased with respect to the source electrode 11, current flows in a path of the source electrode 11, the semiconductor region 41, the first portion 31a, the drift region 20, the drain region 21, and the drain electrode 10.

An operation thereof will be described in detail below while using an energy band of the diodes 35 and 36 described above.

Figure 4A:
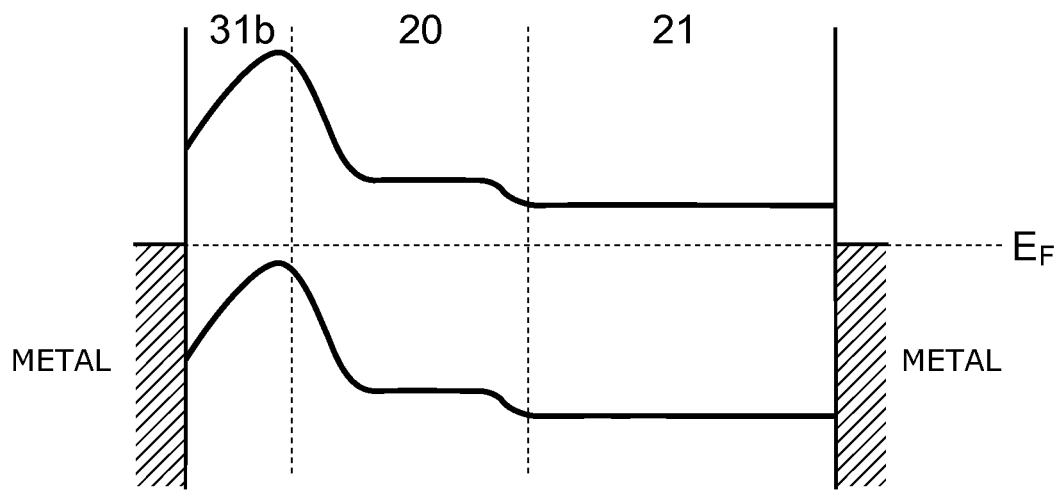
FIG. 4A and FIG. 4B are schematic diagrams showing the energy bands of the diodes according to the embodiment.
Figure 4B:
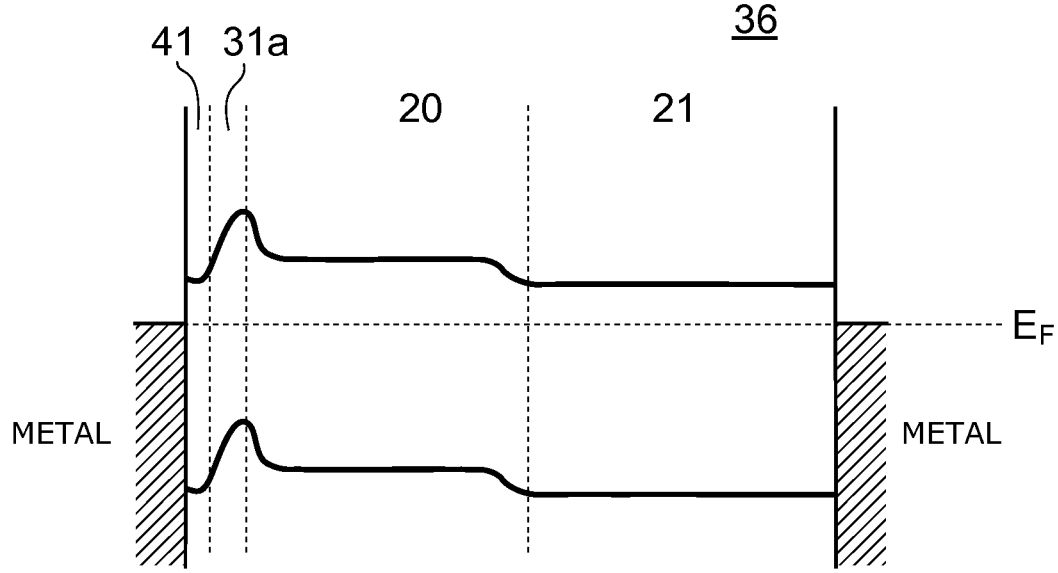

FIG. 4A and FIG. 4B are schematic diagrams showing the energy bands of the diodes according to the embodiment.

Here, a potential curve in the second portion 31b rises from the second portion 31b toward the drift region 20, but in the second portion 31, the potential curve in the second portion 31b may be flat. As described above, in the PIN diode 35 shown in FIG. 4A, when the built-in potential voltage between the second portion 31b and the drift region 20 is exceeded, electrons and holes flow. That is to say, a large current flows between the source and the drain.

Meanwhile, the n+/p−/n-type diode 36 shown in FIG. 4B has the p−-type first portion 31a. The impurity concentration of the first portion 31a is low, and its film thickness is thin. In other words, an energy barrier formed by the first portion 31a is lower compared to an energy barrier of the second portion 31b. That is to say, in the diode 36, the energy barrier is not determined by the material characteristics of the semiconductor material, but the barrier is determined by changing the thickness or the impurity concentration of the first portion 31a.

Therefore, between the first portion 31a and the drift region 20, the voltage of the built-in potential formed between the second portion 31b and the drift region 20 is unnecessary. In other words, in the semiconductor device 1, a current can flow with a lower voltage than the voltage of the built-in potential formed between the second portion 31b and the drift region 20. That is to say, hole current can be suppressed by setting the rising voltage of the diode brought about by the first portion 31a to be lower than the rising voltage of the diode brought about by the second portion 31b. Therefore, conduction loss is reduced in the semiconductor device 1.

Furthermore, with the silicon carbide material, it is necessary to suppress the flow of excessive hole current because there is a possibility of stacking faults described above forming. Therefore, in the semiconductor device 1, the second portion 31b is divided by the first portion 31a. By setting the rising voltage of the first portion 31a to be lower than the second portion 31b in the above manner, it becomes possible to maintain a voltage lower than a voltage that generates hole injection which causes stacking faults even when voltage is applied in an opposite direction to the MOSFET, thus it becomes difficult for stacking faults to form in the semiconductor device 1.

Here, the concentration of the impurity element of the first portion 31a is low, and injection of holes from the first portion 31a to the drift region 20 is difficult. That is to say, electron current mainly flows, and the diode 36 operates by a unipolar operation. However, when the drain electrode 10 is positively biased with respect to the source electrode 11, there is a possibility that electron current flows from the source side to the drain side in the diode 36, because its electron barrier is low. However, when the drain electrode 10 is positively biased with respect to the source electrode 11, a depletion layer expands from the p-n junction of the second portion 31b and the drift region 20 on the PIN diode 35 to the second portion 31b and the drift region 20, and the leakage current is thereby suppressed. Furthermore, the depletion layer more reliably extends in the X-direction and the Y-direction directly under the first portion 31a because the first portion 31a is formed deeper than the second portion 31b. Therefore, leakage current can be reliably suppressed in the semiconductor device 1.

Further, the semiconductor region 41 which is a portion of the diode 36 can be diverted to the source region of the MOSFET. In addition, the second portion 31b of the semiconductor region 31 which is a portion of the diode 36 can be diverted to the base region of the MOSFET.

For example, as shown in FIG. 3B, the gate electrode 50 is brought into contact with the semiconductor region 41, the semiconductor region 31 (second portion 31b), and the drift region 20 via the gate insulating film 51. In other words, a portion of the diodes 35 and 36 may be a MOS structure. Therefore, size reduction in the semiconductor device can be realized.

Figure 5A:
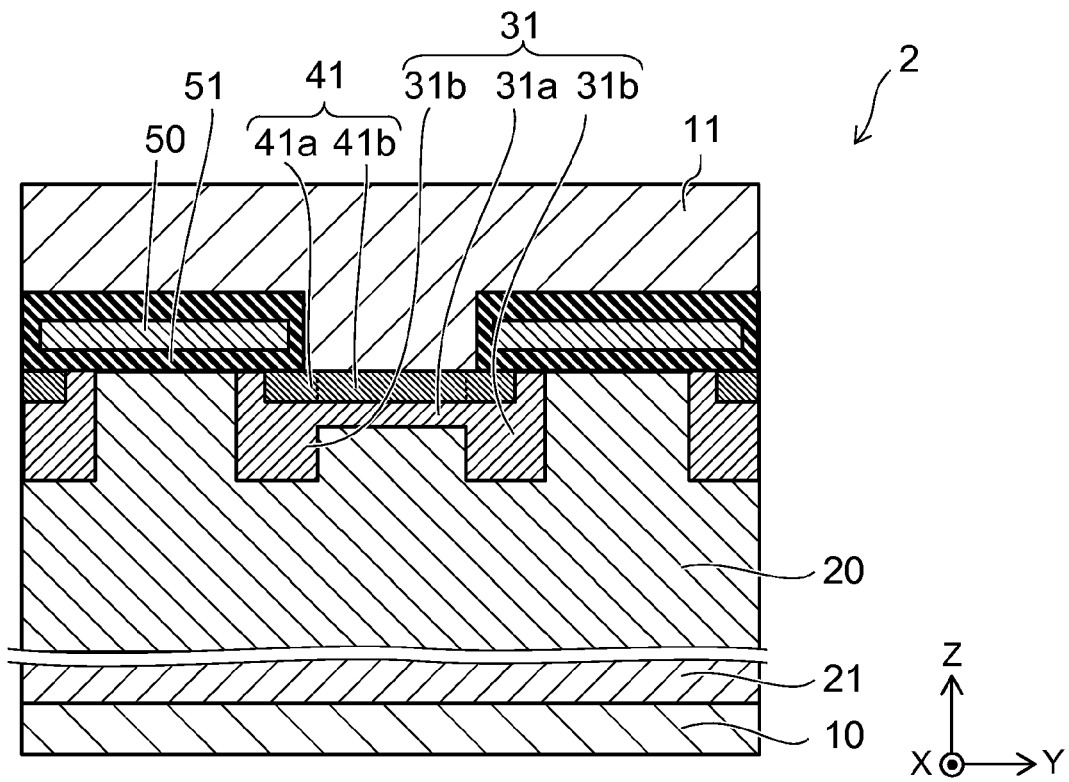
FIG. 5A is a schematic cross-sectional view showing a semiconductor device according to a first variation of the embodiment.
Figure 5B:
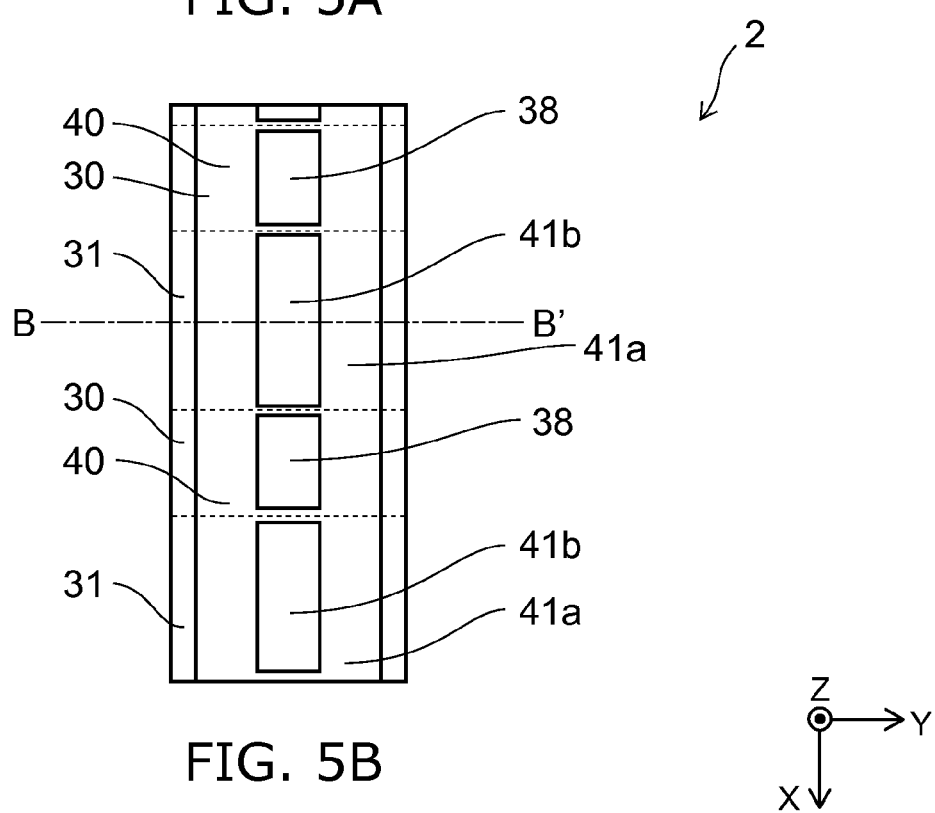
FIG. 5B is a schematic plan view showing the semiconductor device according to the first variation of the embodiment.

FIG. 5A is a schematic cross-sectional view showing a semiconductor device according to a first variation of the embodiment, and FIG. 5B is a schematic plan view showing the semiconductor device according to the first variation of the embodiment.

Here, a cross-section on the B-B' line of FIG. 5B is shown in FIG. 5A. Further, an enlarged view of the source region 40 and the area near the semiconductor region 41 is shown in FIG. 5B.

Figure 6A:
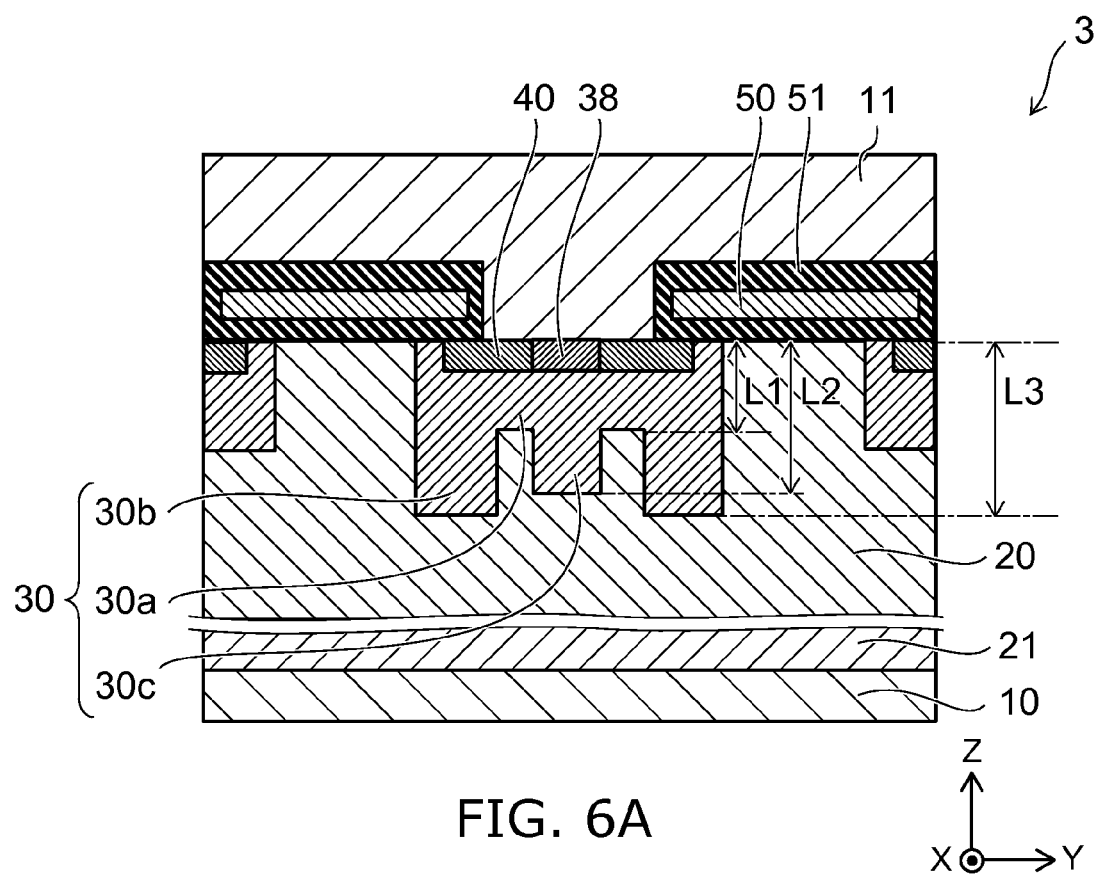
FIG. 6A is a schematic cross-sectional view showing a semiconductor device according to a second variation of the embodiment.

The semiconductor device 2 has a portion 41a and a portion 41b with different respective impurity concentrations in the semiconductor region 41. As one example, the source region 40 and the semiconductor region 41 are alternately arranged in the X-direction. Further, the contact region 38 is sandwiched between the semiconductor regions 41 adjacent in the X-direction. This type of structure is also included in the embodiment. Note that, as described above, it is not limited to the example where the source region 40 and the semiconductor region 41 are alternately arranged. FIG. 6A is a schematic cross-sectional view showing a semiconductor device according to a second variation of the embodiment, and FIG. 6B is a schematic plan view showing the semiconductor device according to the second variation of the embodiment.

Figure 6B:
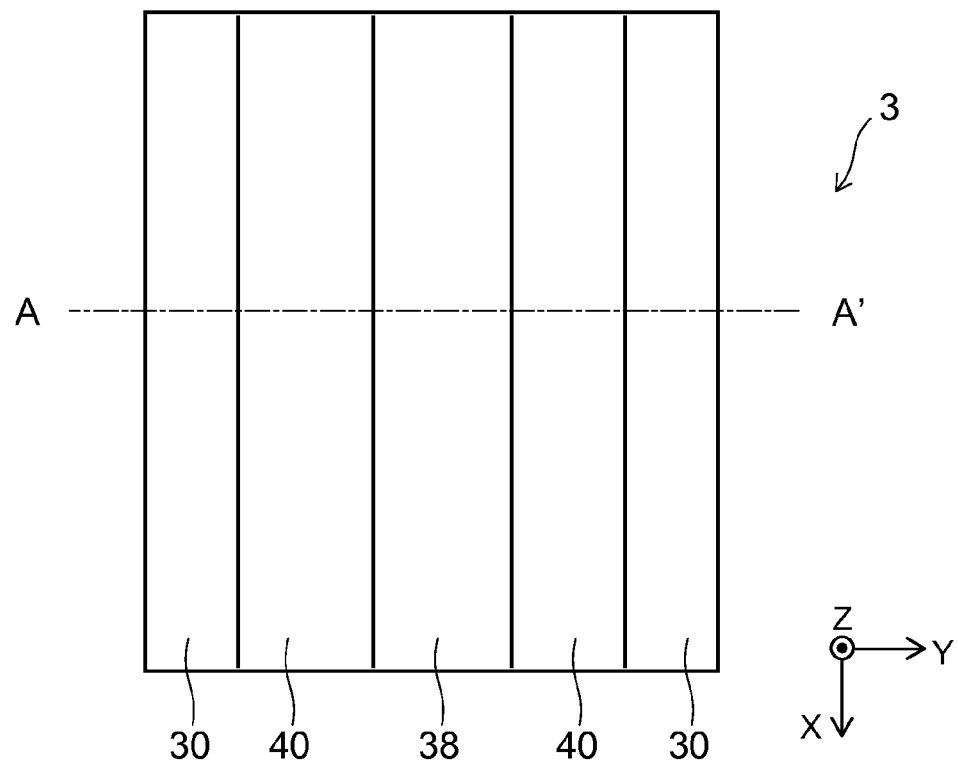
FIG. 6B is a schematic plan view showing the semiconductor device according to the second variation of the embodiment.

Here, a cross-section on the A-A' line of FIG. 6B is shown in FIG. 6A. Further, an enlarged view of the source region 40 and the area near the contact region 38 is shown in FIG. 6B.

A semiconductor device 3 has a structure where a MOSFET and a reflux diode are integrated. In the semiconductor device 3, the contact region 38 is sandwiched between the source regions 40 in the Y-direction. The source region 40 and the contact region 38 are provided on the base region 30.

Here, the base region 30 has a portion 30a with a thin film thickness, a portion 30b with a thick film thickness, and a portion 30c with a thickness between the previous two thicknesses. The impurity concentration of the portion 30a may be set to be lower than the impurity concentration of the portion 30b. Therefore, a diode with the same action as the diode 35 described above is formed by the source region 40/region 30b/drift region 20, and a diode with the same action as the diode 36 described above is formed by the source region 40/region 30a/drift region 20 and the source region 40/region 30C/drift region 20. Note that the relationship of the lengths L1, L2, L3 shown in the diagrams satisfies L1<L2<L3. This type of structure is also included in the embodiment.

Figure 7A:
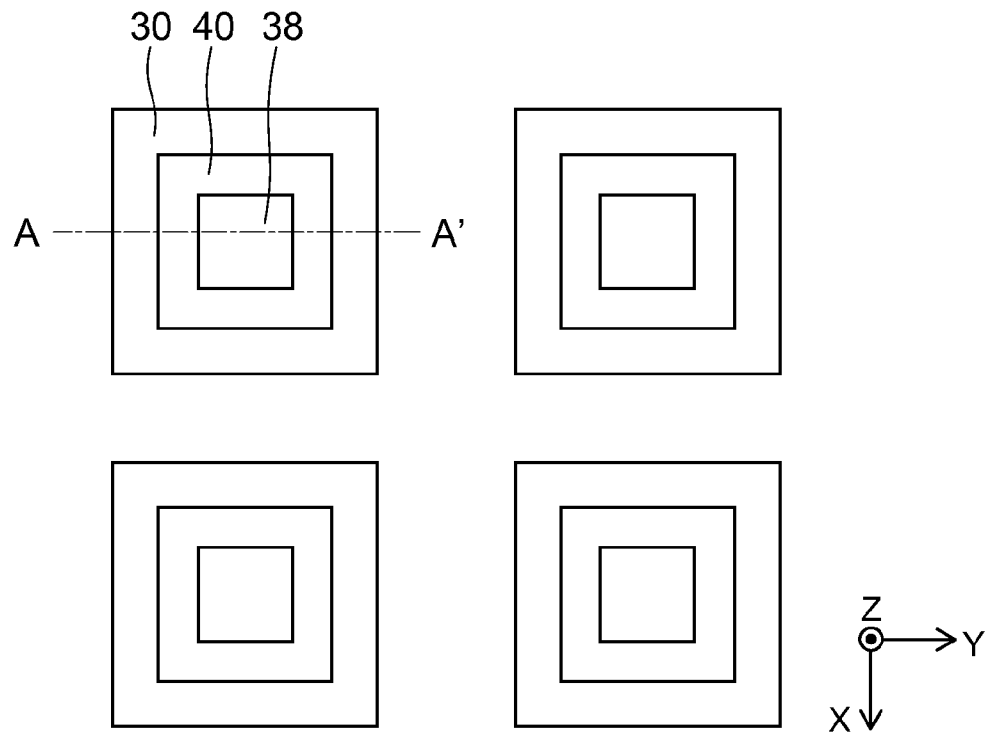
FIG. 7A is a schematic cross-sectional view showing a semiconductor device according to a third variation of the embodiment.
Figure 7B:
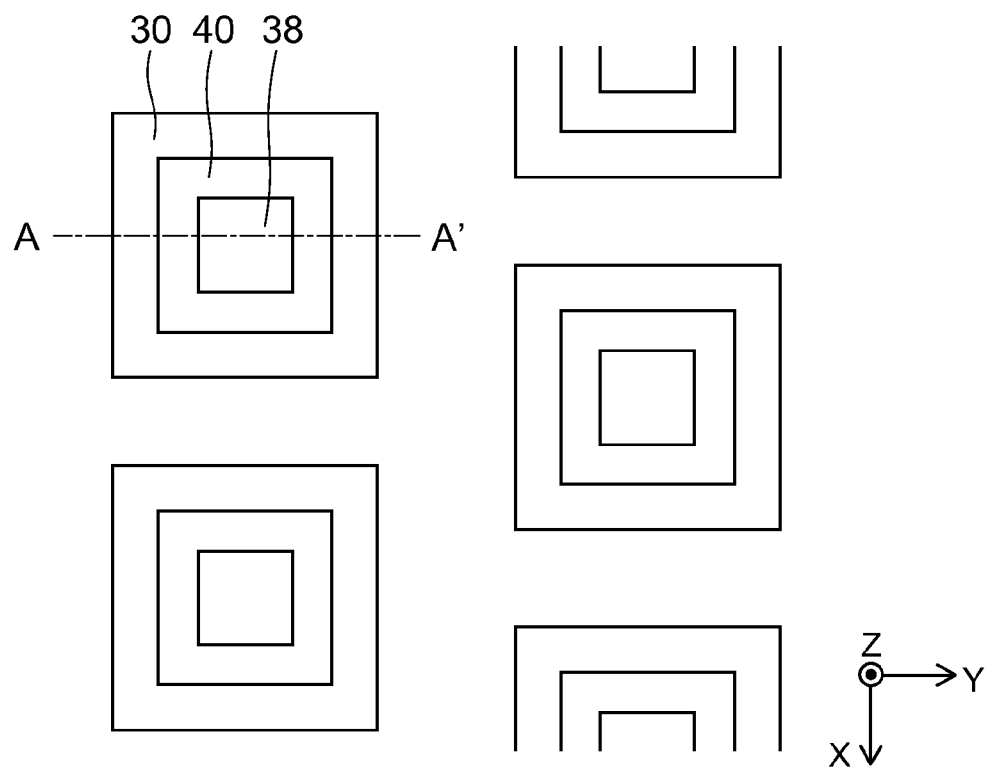
FIG. 7B is a schematic plan view showing the semiconductor device according to the fourth variation of the embodiment.

FIG. 7A is a schematic cross-sectional view showing a semiconductor device according to a third variation of the embodiment, and FIG. 7B is a schematic plan view showing the semiconductor device according to the fourth variation of the embodiment.

In FIG. 6B, an example is shown of a structure where the source region 40, the contact region 38, and the base region 30 extend in stripes in the X-direction, but not limited thereto.

For example, in FIG. 7A, a group of the source region 40, the contact region 38, and the base region 30 is disposed in a grid pattern in the X-direction and the Y-direction. Further, with the disposition of this grid pattern, a phase may deviate in the X-direction as shown in FIG. 7B. Note that when viewed from above, the shapes of the source region 40, the contact region 38, and the base region 30 are not limited to a square shape, and may be other polygons (triangle, pentagon, hexagon and the like) or a circle.

As such, the incorporation of a reflux diode function in a MOS structure in the semiconductor device 1, reduces chip cost or module cost. Further, a diode is not so-called externally attached, but is a built-in diode and thus can reduce the chip surface area.

Further, when the MOSFET and the reflux diode are bundled in one cell, any of the following cases are included in the embodiment: the bundled objects are in line in a predetermined direction; only the bundled objects and the reflux diode are in line; the bundled objects, the MOSFET, and the reflux diode are in line; and the bundled objects and the MOSFET are in line.

Although the embodiments are described above with reference to the specific examples, the embodiments are not limited to these specific examples. That is, design modification appropriately made by a person skilled in the art in regard to the embodiments is within the scope of the embodiments to the extent that the features of the embodiments are included. Components and the disposition, the material, the condition, the shape, and the size or the like included in the specific examples are not limited to illustrations and can be changed appropriately.

The components included in the embodiments described above can be combined to the extent of technical feasibility and the combinations are included in the scope of the embodiments to the extent that the feature of the embodiments is included. Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    a first electrode;
    a second electrode;
    a first semiconductor region of a first conductivity type provided between the first electrode and the second electrode;
    a second semiconductor region of a second conductivity type provided between the first semiconductor region and the second electrode, wherein the first conductivity type is different from second conductivity type;
    a third semiconductor region of the first conductivity type provided between the second semiconductor region and the second electrode, and the third semiconductor region having an impurity concentration higher than an impurity concentration of the first semiconductor region;
    a third electrode contacting the third semiconductor region, the second semiconductor region, and the first semiconductor region via an insulating film;
    a fourth semiconductor region of the second conductivity type provided between the first semiconductor region and the second electrode, the fourth semiconductor region including a first portion and second portions, the first portion being provided between the second portions; and
    a fifth semiconductor region of the first conductivity type provided between the fourth semiconductor region and the second electrode, and the fifth semiconductor region having an impurity concentration higher than the impurity concentration of the first semiconductor region, the fifth semiconductor region being provided between the first portion and the second electrode, and
    a distance between a first boundary between the second electrode and the fifth semiconductor region and a second boundary between the first semiconductor region and one of the second portions being larger than a distance between the first boundary and a third boundary between the first semiconductor region and the first portion in a first direction from the first electrode toward the second electrode.

2. The device according to claim 1, wherein
    an impurity concentration of the second portions is higher than an impurity concentration of the first portion.

3. The device according to claim 1, wherein the second semiconductor region and the fourth semiconductor region are arranged in a second direction intersecting the first direction.

4. The device according to claim 1, wherein a width of the fourth semiconductor region is narrower than a width of the second semiconductor region in a second direction intersecting the first direction.

5. The device according to claim 1, wherein a width of the fifth semiconductor region is narrower than a width of the third semiconductor region in a second direction intersecting the first direction.

6. The device according to claim 1, wherein a width of the fourth semiconductor region is wider than a width of the second semiconductor region in a second direction intersecting the first direction.

7. The device according to claim 1, wherein a width of the fifth semiconductor region is wider than a width of the third semiconductor region in a second direction intersecting the first direction.

8. The device according to claim 1, wherein the fifth semiconductor region includes
    a third portion, and
    fourth portions sandwiching the third portion, and having an impurity concentration different from an impurity concentration of the third portion.

9. The device according to claim 1, wherein the third electrode extends in a second direction intersecting the first direction, and contacts the fifth semiconductor region, the fourth semiconductor region, and the first semiconductor region via an insulating film.

10. The device according to claim 1, further comprising a sixth semiconductor region of the second conductivity type provided between the second semiconductor region and the second electrode, the sixth semiconductor region contacting the third semiconductor region and having an impurity concentration higher than an impurity concentration of the second semiconductor region.

11. The device according to claim 1, wherein an impurity concentration of the third semiconductor region is different from an impurity concentration of the fifth semiconductor region.

12. A semiconductor device, comprising:
a first electrode;
a second electrode; and
a first semiconductor region of a first conductivity type provided between the first electrode and the second electrode;
a second semiconductor region of a second conductivity type provided between the first semiconductor region and the second electrode, the second semiconductor region having sixth portions, seventh portions, and an eighth portion, the eighth portion being provided between the sixth portions, and the eighth portion and the sixth portions being provided between the seventh portions, wherein the first conductivity type is different from second conductivity type;
a third semiconductor region of the first conductivity type provided between the second semiconductor region and the second electrode, and having an impurity concentration higher than an impurity concentration of the first semiconductor region; and
a third electrode contacting the third semiconductor region, the second semiconductor region, and the first semiconductor region via an insulating film,
a first distance between a fourth boundary between the second electrode and the third semiconductor region and a fifth boundary between the first semiconductor region and one of the sixth portions being smaller than a second distance between the fourth boundary and a sixth boundary between the first semiconductor region and one of the seventh portions in a first direction from the first electrode toward the second electrode, a third distance between the fourth boundary and a seventh boundary between the first semiconductor region and the eighth portion being larger than the first distance in the first direction, and the third distance being smaller than the second distance in the first direction.

13. The device according to claim 12 wherein
the third semiconductor region is provided between the second electrode and one of the sixth portions.

14. The device according to claim 12, wherein an impurity concentration of the sixth portions is higher than an impurity concentration of the seventh portions.

15. A semiconductor device, comprising:
a first electrode;
a second electrode;
a first semiconductor region of a first conductivity type provided between the first electrode and the second electrode;
a third electrode provided between the second electrode and the first semiconductor region via a first insulating film,
a fourth electrode provided between the second electrode and the first semiconductor region via a second insulating film, the fourth electrode being provided beside the third electrode in a third direction intersecting a first direction from the first electrode toward the second electrode;
a second semiconductor region of a second conductivity type provided between the first semiconductor region and the second electrode, between the first semiconductor region and the first insulating film, and between the first semiconductor region and the second insulating film;
a third semiconductor region of the first conductivity type, the third semiconductor region including a first region and a second region, the first region being provided between the second semiconductor region and the second electrode and between the second semiconductor region the third electrode, the second region being provided between the second semiconductor region and the second electrode and between the second semiconductor region the fourth electrode;
a sixth semiconductor region of a second conductivity type provided between the first region and the second region, and the sixth semiconductor region being provided between the second semiconductor region and the second electrode;
a fourth semiconductor region of the second conductivity type provided between the first semiconductor region and the second electrode, the fourth semiconductor region being provided beside the second semiconductor region in a second direction intersecting the first direction and the third direction, and the sixth semiconductor region not being overlapped with the fourth semiconductor region in the first direction, wherein the first conductivity type is different from the second conductivity type, and
wherein the fourth semiconductor region includes a first portion and second portions, the first portion is provided between the second portions, and
wherein a distance between a lower end of the second electrode and a boundary between the first semiconductor region and one of the second portions is larger than a distance between the lower end of the second electrode and a boundary between the first semiconductor region and the first portion in a first direction from the first electrode toward the second electrode.

16. The device according to claim 15, wherein an impurity concentration of the second portions is higher than an impurity concentration.

* * * * *